United States Patent [19]

Hirose et al.

[11] Patent Number: 4,633,809
[45] Date of Patent: Jan. 6, 1987

[54] AMORPHOUS SILICON FILM FORMING APPARATUS

[75] Inventors: Masataka Hirose, Hiroshima; Tsuyoshi Ueno, Fujisawa; Katsumi Suzuki, Tokyo, all of Japan

[73] Assignee: Kabushiki Kaisha Toshiba, Kawasaki, Japan

[21] Appl. No.: 607,310

[22] Filed: May 4, 1984

[30] Foreign Application Priority Data

May 10, 1983 [JP] Japan .................................. 58-81462

[51] Int. Cl.⁴ ............................................ C23C 13/08
[52] U.S. Cl. ..................................... 118/719; 118/723; 118/50.1
[58] Field of Search ....................... 118/723, 719, 50.1, 118/732; 427/38, 39

[56] References Cited

U.S. PATENT DOCUMENTS

| | | | |
|---|---|---|---|
| 4,064,521 | 12/1977 | Carlson | 357/2 |
| 4,173,661 | 11/1979 | Bourdon | 427/39 |
| 4,225,222 | 9/1980 | Kempter et al. | 430/135 X |
| 4,298,443 | 11/1981 | Maydan | 204/192 E |
| 4,317,844 | 2/1982 | Carlson | 427/39 |
| 4,379,943 | 4/1983 | Yang et al. | 427/39 |
| 4,400,410 | 8/1983 | Green et al. | 427/39 |
| 4,404,076 | 9/1983 | Nakagawa et al. | 427/39 X |
| 4,418,645 | 12/1983 | Knights et al. | 118/723 X |
| 4,438,188 | 3/1984 | Shimatani et al. | 427/39 |
| 4,450,787 | 5/1984 | Weakliem et al. | 118/50.1 X |
| 4,461,239 | 7/1984 | Cannella et al. | 118/719 X |
| 4,478,173 | 10/1984 | Doehler | 118/50.1 |

FOREIGN PATENT DOCUMENTS 57-66639 4/1982 Japan ................................... 156/345

OTHER PUBLICATIONS

Page 216 of Encyclopedia Chimica.

Primary Examiner—Richard Bueker
Attorney, Agent, or Firm—Cushman, Darby and Cushman

[57] ABSTRACT

An amorphous silicon film forming apparatus forms an amorphous silicon film on a substrate. The apparatus is provided with a sealed vessel whose inside space is defined as a reaction chamber. A gas inlet pipe for introducing a gas containing SiH4 into the reaction chamber is connected to the vessel. A facing electrode provided in the reaction chamber and a power source connected to the facing electrode convert in a plasma generating region the gas introduced into the reaction chamber by the gas inlet pipe into plasma. A conductive mesh structure is disposed in the reaction chamber so as to surround the plasma generating region.

6 Claims, 4 Drawing Figures

AMORPHOUS SILICON FILM FORMING APPARATUS

BACKGROUND OF THE INVENTION

The present invention relates to an amorphous silicon film forming apparatus for forming an amorphous silicon film on a substrate, and more specifically to an improvement of an amorphous silicon film forming apparatus which forms an amorphous silicon film on a filming object (substrate) by introducing a gaseous silicon-containing compound into a reaction chamber and causing a glow discharge.

Presently, amorphous silicon (hereafter referred to as a-Si) is being used as an excellent photoconductive material to be applied to photoelectric conversion members, solar batteries, photosensitive materials for electrophotography, film transistors, etc. Many a-Si films have already been put to practical use.

The a-Si has advantages such that it can be formed into a structure of a wider area than single crystal, and its film can be formed on filming objects (substrates) of various shapes. Therefore, the a-Si is expected to be further developed and applied to various uses.

Existing methods for forming a-Si films include the high-frequency glow discharge method, reactive sputtering method, CVD method, etc. In a current method using high frequency glow discharge, a-Si films are formed by decomposing a gas containing silicon atoms as the raw gas, e.g., SiH4, Si2H6 or other silicon hydride gas.

FIG. 1 shows a prior art amorphous silicon film forming apparatus using the aforesaid method. In FIG. 1, numeral 1 designates a vacuum reaction vessel. A base 3 is disposed at the bottom portion of a reaction chamber 2 of the vacuum reaction vessel 1. A facing electrode 5 is attached to the ceiling of the vacuum reaction vessel 1 through the medium of an electrical insulator 4.

A conductive substrate 6 as a filming object set on the base 3 can be heated by a heater 7.

The facing electrode 5 is connected to a power source, such as a high-frequency power source or D.C. power source, for causing electrical discharge while the conductive substrate 6 is grounded.

Also, the vacuum reaction vessel 1 is connected individually with a high-vacuum exhaust system 10, a large-flow exhaust system 12, and a material gas supply system 14 through a valve 9, a gas pressure regulating valve 11, and a gas valve 13, respectively.

In forming a film, the gas valve 13 and the gas pressure regulating valve 11 are closed in advance. Then, the valve 9 is opened, and the vacuum reaction vessel 1 is evacuated to $10^{-6}$ torr or thereabouts by means of the high-vacuum exhaust system 10 using a diffusion pump, rotary pump (not shown), etc. At this time, the conductive substrate 6 is adjusted to a predetermined temperature between 150° C. and 300° C. by the heater 7.

Then, the gas valve 13 is opened, and a gaseous silicon-containing compound, such as SiH4 or Si2H6 gas (or a mixture of the gaseous silicon-containing compound and B2H6, PH3 gas, or other gas used as required, or a mixture of the gaseous silicon-containing compound and a gaseous carbon-containing compound, gaseous nitrogen-containing compound or gaseous oxygen-containing compound) is introduced as a material gas 15 into the vacuum reaction vessel 1. At the same time, the valve 9 is closed, and the gas pressure regulating valve 11 is opened, so that the exhaust system is switched from the high-vacuum exhaust system 10 including the diffusion pump, rotary pump, etc., to the large-flow exhaust system 12 including a mechanical booster pump, rotary pump (not shown), etc.

Subsequently, the gaseous silicon-containing compound and/or other doping gases are regulated by a flow controller (not shown) for a predetermined flow rate. Meanwhile, the pressure inside the vacuum reaction vessel 1 is adjusted to a predetermined value between 0.1 torr and 1.0 torr by operating the valve 11 connected to the mechanical booster pump.

Thereafter, a high-frequency electric power from the power source 8, with a frequency of 13.56 MHz and ranging from 10 W to 1 kW, is applied between the substrate 6 and the facing electrode 5 opposed thereto. As a result, glow discharge is produced between the base 3 and the facing electrode 5.

Thus, a plasma of gaseous silicon-containing compound or a mixture of the gaseous silicon-containing compound and the doping gas is produced, and an a-Si film starts to be formed on the substrate 6.

Radicals of the gaseous silicon-containing compound and/or other gases that are not conductive to the formation of the film are discharged through the large-flow exhaust system 12, passed through a combustion tower and a water scrubber, and then discharged into the open air.

In this film forming process using the glow discharge, the radicals of the gaseous silicon-containing compound could possibly undergo polymerization to produce by-products from silicon powder, depending on the film forming condition.

Hereupon, in forming an a-Si film for a photosensitive material for electrophotography, the film thickness need at least be 15 microns. For reasonable mass production, therefore, it is necessary to increase the film forming speed.

In order to speed up the film forming operation, it is usually necessary to raise the pressure inside the vacuum reaction vessel 1 and to apply greater high-frequency output to the facing electrode 5. However, by film forming under high-pressure, high-output conditions would produce plenty of by-products from the silicon powder. For example, the by-products from the silicon powder are intensively attached to portions A indicated by the dotted areas in FIG. 1. These by-products of the silicon powder if produced in bulk would clog the exhaust system and be trapped in the a-Si film being formed, greatly lowering the film quality. In mass-producing a-Si films, moreover, these by-products would involve many problems. For example, they would require the interior of the vacuum reaction vessel 1 to be cleaned for a long time with every cycle of the film forming operation.

Meanwhile, the film forming speed is limited within a range of about 6 to 8 microns/hour even though the pressure inside the vacuum reaction vessel 1 and the applied high-frequency output are both high. Thus, the mere formation of the a-Si film for the electrophotographic photosensitive material requires at least three hours. Considering the time required for evacuation, raising the substrate temperature, and cooling after film forming, a single cycle of the film forming operation would require about six hours in total. This should constitute a substantial hindrance to mass production.

SUMMARY OF THE INVENTION

The present invention is contrived in consideration of these circumstances and is intended to provide an amorphous silicon film forming apparatus capable of a high-speed film forming operation and preventing the production of powdered products in a reaction chamber, thereby ensuring the formation of very satisfactory amorphous silicon films, despite its simple construction, and facilitating maintenance.

In order to attain the above object of the present invention, there is provided an amorphous silicon film forming apparatus which forms an amorphous silicon film on a substrate by introducing a gaseous silicon-containing compound into a reaction chamber and causing a glow discharge. The present invention is constructed so that a region where a plasma of the gaseous silicon-containing compound is produced is surrounded by a conductive mesh structure and that portion of the gaseous silicon-containing compound outside the mesh structure is fed into the mesh structure through the meshes thereof, owing to the difference in density between the gas outside the mesh structure and that portion of the gaseous silicon-containing compound reduced by the formation of a silicon film on the substrate inside the mesh structure. The mesh structure prevents radicals produced in the plasma generating region surrounded by the mesh structure from dispersing to the outside of the mesh structure, thereby increasing the density of the radicals above the substrate.

DETAILED DESCRIPTION OF THE PREFERRED EMBODIMENTS

Figure 1:
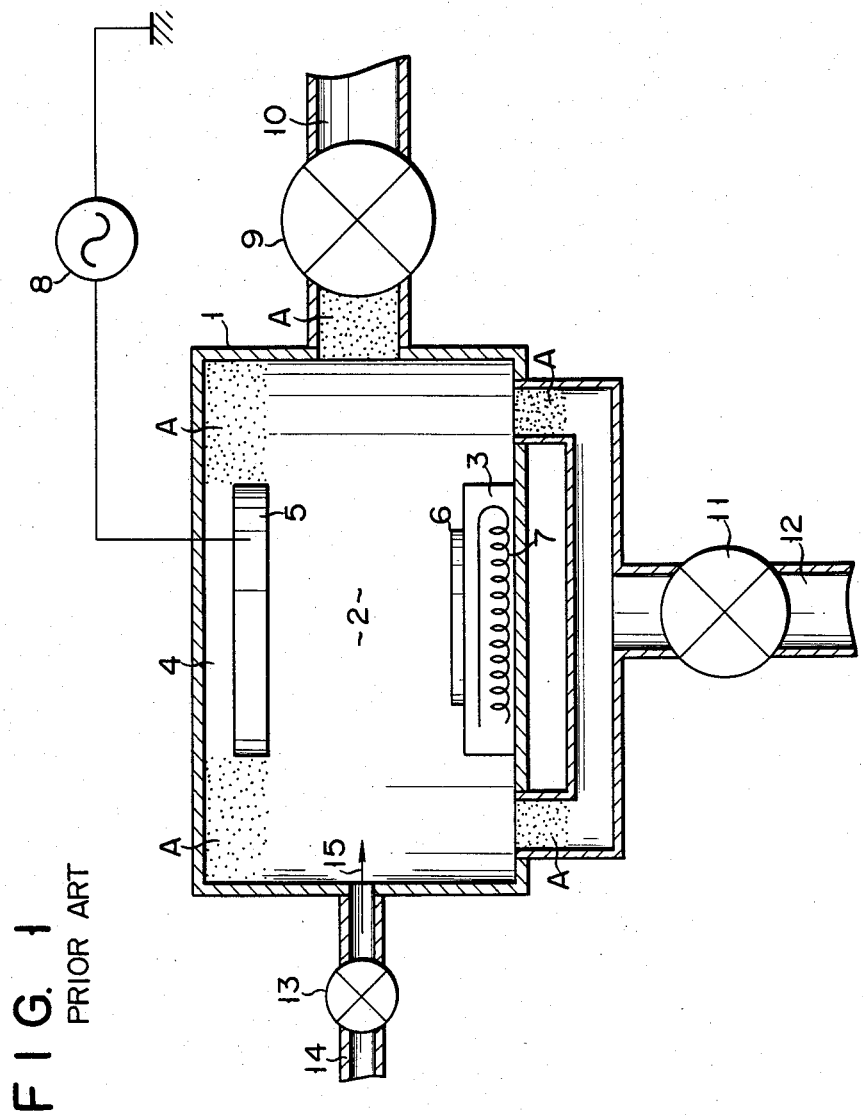
FIG. 1 is a vertical sectional side view schematically showing a prior art film forming apparatus.
Figure 2:
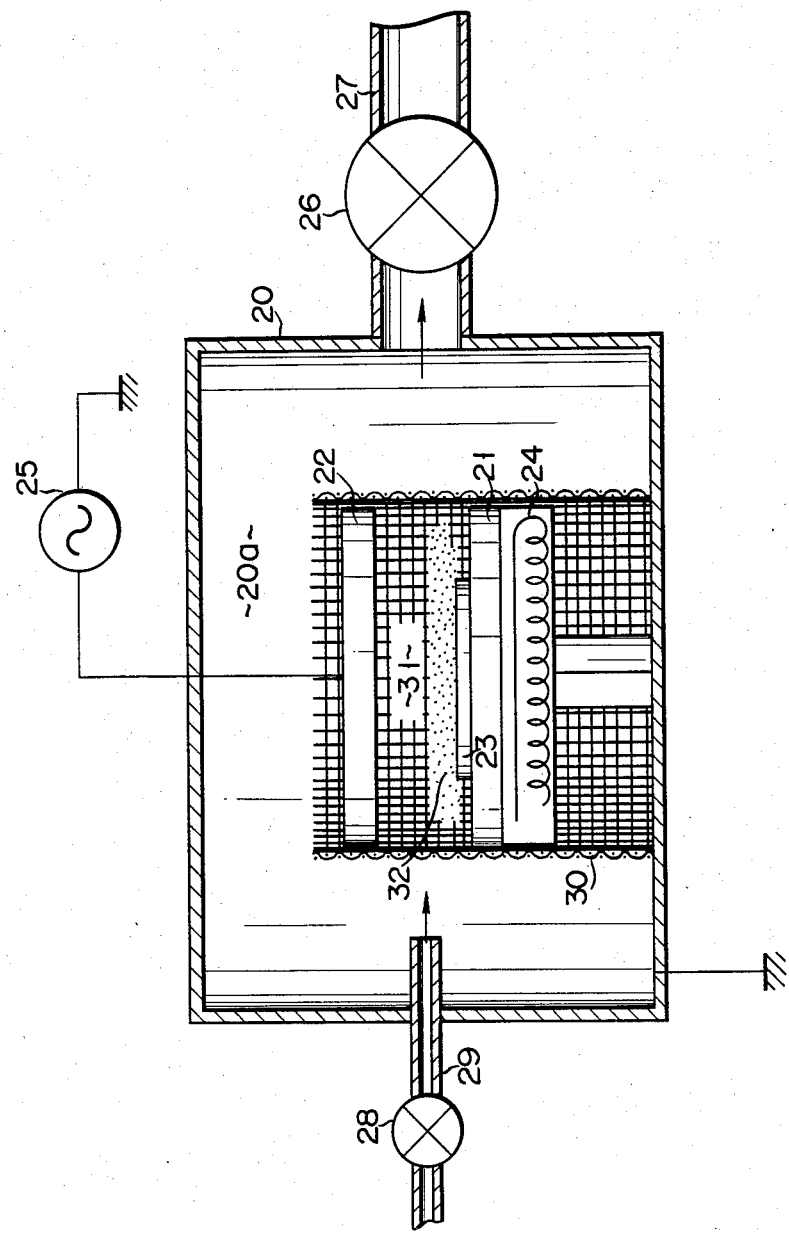
FIG. 2 is a vertical sectional side view schematically showing one embodiment of an amorphous silicon film forming apparatus according to the present invention.
Figure 3:
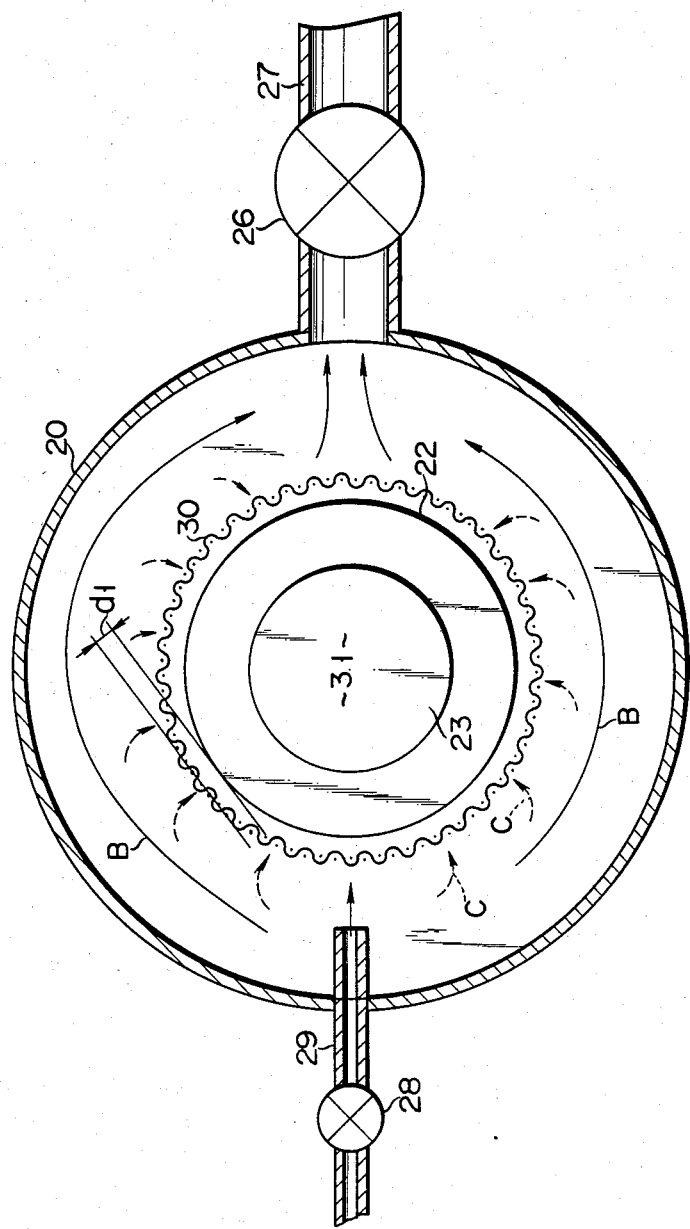
FIG. 3 is a cross-sectional side view schematically showing the film forming apparatus of FIG. 2.

One embodiment of an amorphous silicon film forming apparatus according to the present invention will now be described in detail with reference to the accompanying drawings of FIGS. 2 and 3. FIGS. 2 and 3 show a film forming apparatus for forming an a-Si film on a flat conductive substrate 23 as a filming object. Numeral 20 designates a conductive vacuum reaction vessel whose inside space is defined as a reaction chamber 20a. A base 21 is disposed in the center of the bottom portion of the vacuum reaction vessel 20 in electrically connected relation therewith. A facing electrode 22 lies over the base 21 and is spaced at a predetermined distance therefrom.

The flat conductive substrate 23 as the filming object, grounded and placed on the base 21 is heated by a heater 24.

A power source 25 for causing electric discharge, such as a high-frequency power source, is connected to the facing electrode 22. The vacuum reaction vessel 20 is connected individually with an exhaust mechanism 27 including a valve 26 and a gas inlet pipe 28 provided with a valve 28.

A cylindrical mesh structure 30 (mesh size: 50, by Japanese Industrial Standard; that is 50 holes/inch) is disposed so as to be grounded in the vacuum reaction vessel 20. The base 21 and the facing electrode 22 are housed in the mesh structure 30. Thus, a plasma generating region 31 between the facing electrode 22 and the base 21, in which plasma is mainly produced, is surrounded by the mesh structure 30.

Thus, the present embodiment is characterized in that the plasma generating region 31 is surrounded by the mesh structure 30 so that radicals, such as $SiH_4^*$, $SiH_3^*$, $SiH_2^*$ and $SiH^*$, are prevented from dispersing to the outside of the mesh structure 30.

According to such an arrangement, a gaseous silicon-containing compound or a mixture of gaseous silicon-containing compound and a doping gas used as required is introduced into the vacuum reaction vessel 20 by means of the gas inlet pipe 29. The greater part of the introduced gas, as indicated by solid arrows B in FIG. 3, is discharged through the space between the cylindrical mesh structure 30 and the side wall of the vacuum reaction vessel 20 by the exhaust mechanism 27 including the valve 26. Between the facing electrode 22 and the base 21, a radical of the gaseous silicon-containing compound or the gas mixture is produced by a glow discharge. Thus, the a-Si film is formed on the substrate 23 and useless gases are prevented from entering into the region 31 between the facing electrode 22 and the base 21. Therefore, it is theoretically impossible for a by-product of silicon powder to be produced by polymerization of surplus radicals.

Also, the plasma generating region 31 is surrounded by the mesh structure 30 so that the radicals are prevented from dispersing to the outside of the mesh structure 30. Accordingly, a positive column existing between the facing electrode 22 and the base 21 extends vertically, forming a positive column 32 (dotted portion in FIG. 2) with very high luminous intensity in close vicinity to the substrate 23. Thus, the inventors hereof recognized that the aforesaid arrangement leads to a great increase in the film forming speed.

As the a-Si film (not shown) is formed on the substrate 23, the density of the gaseous silicon-containing compound inside the mesh structure 30 is reduced. As indicated by broken arrows C in FIG. 3, only a required amount of gas is supplied through the mesh structure 30 to the inside thereof by osmotic pressure produced by the difference in density. Thus, the a-Si film can be formed with high efficiency.

In this first embodiment, moreover, high-frequency output applied to the facing electrode 22 is concentrated on the nearest grounded area. The mesh structure 30 corresponds to this area. Accordingly, if the facing electrode 22 and the base 21 were simply surrounded by the mesh structure 30 without any special consideration, only the intensity of plasma radiation, produced between the facing electrode 22 and the mesh structure 30, would be augmented in proportion to the increase of the high-frequency output, and the high-frequency output would not be applied to the plasma generating region 31 between the facing electrode 22 and the base 21.

According to this embodiment, therefore, the apparatus is deliberately designed so that the distance d1 between the facing electrode 22 and the mesh structure 30 is shorter than the mean free path of electrons existing in the plasma generating region 31.

If the pressure inside the vacuum reaction vessel 20 ranges from 0.1 to 1.0 torr, the distance d1 can be set to 5 mm or less. In this embodiment, d1 is set to 3 mm. With this setting, the space between the facing electrode 22 and the mesh structure 30 forms the so-called dark space shield region, which produces no plasma radiation.

Accordingly, if greater high-frequency output is supplied, then the high-frequency output applied between the facing electrode 22 and the base 21 is increased in proportion. Also, the luminous intensity of the positive column 32 in the vicinity of the substrate 23 is increased to raise the film forming speed.

A specific example will now be described in further detail.

First, the vacuum reaction vessel 20 is evacuated to $10^{-6}$ torr, and the substrate 23 is heated to 230° C. Thereafter, the valve 28 is opened, and 50 SCCM of pure SiH4 gas is introduced into the vacuum reaction vessel 20. At the same time, the exhaust mechanism 27 is switched from a high-vacuum exhaust system, including a diffusion pump and a rotary pump, to a large-flow exhaust system, including a mechanical booster pump and a rotary pump.

After the pressure inside the vacuum reaction vessel 20 is adjusted to 0.2 torr, a high-frequency output of 50 W is applied to the facing electrode 22, and an a-Si:H film (not shown) is formed in one hour.

Thereafter, the supply of the SiH4 gas is stopped, and the valve 26 is fully opened. Thus, the vacuum reaction vessel 20 is evacuated to $10^{-4}$ torr. When the temperature of the substrate 23 is lowered to 100° C. or less, the substrate 23 is taken out into the open air.

The thickness of the a-Si:H film formed in this manner measured 15 microns.

As for the electrical characteristics of the film, the dark resistivity was $10^{11}$ Ω.cm, and the light resistivity for radiation of light with a wavelength of 650 microns at a rate of $10^{15}$ photons/cm$^2$.sec was $10^7$ Ω.cm. These characteristics are by no means inferior to those of the a-Si:H film formed at low speed on the prior art apparatus.

No by-products from silicon powder were found in the vacuum reaction vessel 20.

Figure 4:
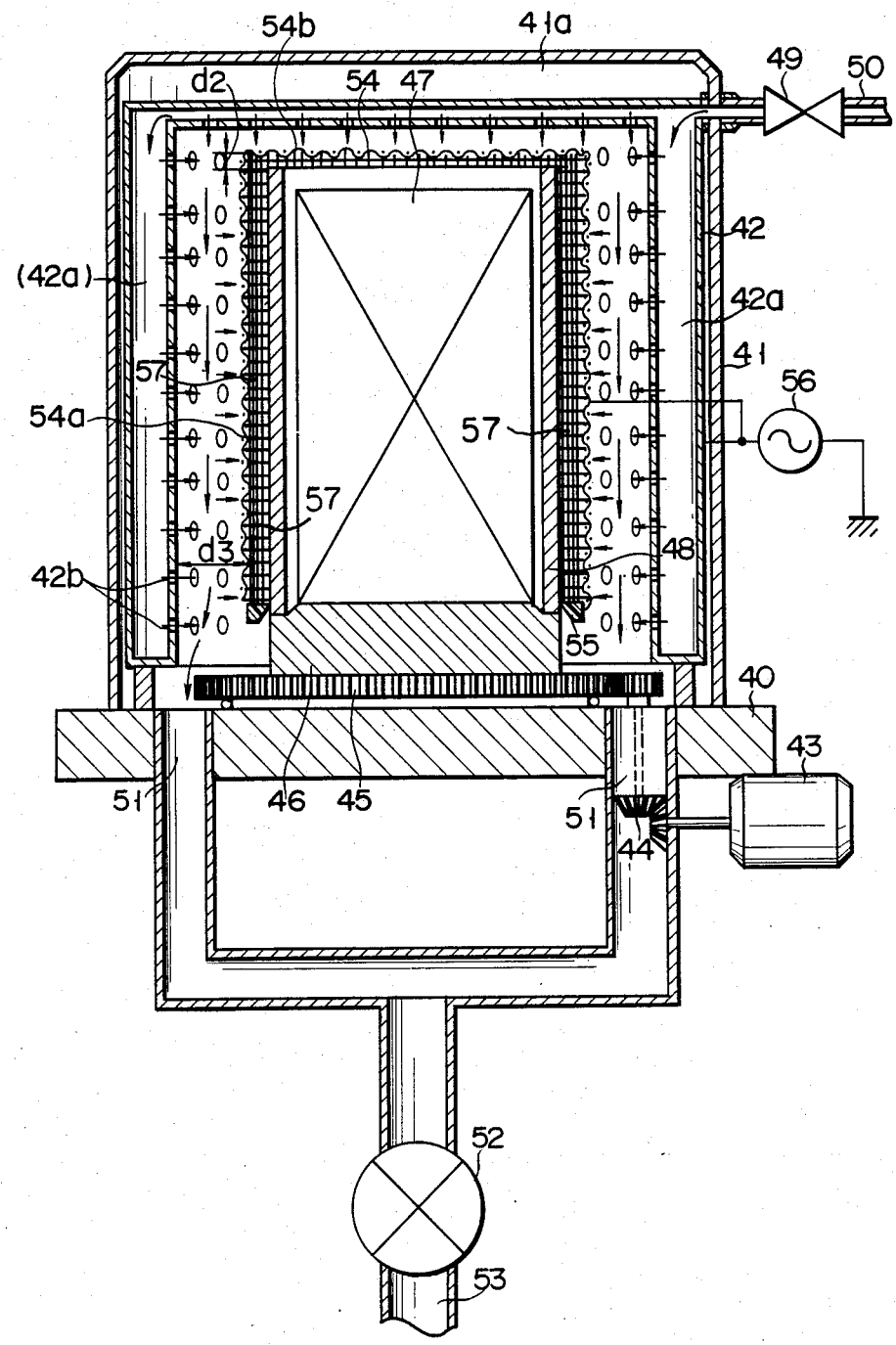
FIG. 4 is a vertical sectional side view schematically showing another embodiment of the amorphous silicon film forming apparatus according to the invention.

Referring now to FIG. 4, another embodiment of the amorphous silicon film forming apparatus of the invention will be described. In this second embodiment, a drum-shaped substrate 48, which can serve as a photoconductive drum for electrophotography, is used for the filming object.

In FIG. 4, numeral 40 designates a base. Placed on the top of the base 40 is a vacuum reaction vessel 41 whose inside space is defined as a reaction chamber 41a. A hollow, bottomed cylindrical gas jet member 42, doubling as a facing electrode, is set in the vacuum reaction vessel 41 so that its bottom portion is located on the upper side.

Mounted on the base 40 is a turntable 45 rotated at a fixed speed by a gear mechanism 44 driven by a motor 43. The turntable 45 carries thereon a cradle 46 on which are mounted a heater 47 and the drum-shaped conductive substrate 48 as the filming object (made of e.g. aluminum) fitted on the heater 47.

A gas inlet pipe 50 with a valve 49 is connected to the upper end portion of a gas passage 42a, which is defined by the hollow inside space of the facing electrode/gas jet member 42. The interior of the vacuum reaction vessel 41 connects with an exhaust mechanism 53 including a valve 52 by means of a plurality of exhaust ports 51 bored through the base 40.

A bottomed cylindrical mesh structure 54 (mesh size: 50, by Japanese Industrial Standard that is, 50 holes/inch) is disposed between the facing electrode/gas jet member 42 and the drum-shaped conductive substrate 48 so that a flat portion 54b constituting the bottom of the mesh structure 54 is on the upper side. The drum-shaped substrate 48 is surrounded by the mesh structure 54 and a ring 55 of Teflon (trade name) attached to the inner peripheral edge of the bottom opening of the mesh structure 54.

A power source 56 for causing electric discharge, such as a high-frequency power source, is connected to the facing electrode/gas jet member 42 and the mesh structure 54.

According to such an arrangement, the gaseous silicon-containing compound or the mixture of the gaseous silicon-containing compound and the doping gas used as required is introduced into the gas passage 42a of the facing electrode/gas jet member 42 via the valve 49.

Then, the gas is jetted out toward the drum-shaped substrate 48 through a plurality of exhaust nozzles 42b. A cylindrical portion 54a and the flat portion 54b of the conductive mesh structure 54 are located between the drum-shaped substrate 48 and the facing electrode/gas jet member 42. Therefore, the greater part of the gas moves downward to be discharged through the exhaust ports 51.

the distance d3 between the gas jet member 42 and the mesh structure 54 and the distance d2 between the mesh structure 54 and the drum-shaped substrate 48 have the relationship d2<<d3. Thus, most of the gas is discharged downward.

Since high-frequency output is applied to the facing electrode/gas jet member 42 and the mesh structure 54, these two members are at the same potential, and plasma is produced between the mesh structure 54 having a potential gradient and the drum-shaped substrate 48.

It is to be understood that, at that time, the distance d2 between the flat portion 54b of the mesh structure 54 and the drum-shaped substrate 48 is shorter than the mean free path of the electrons exsisting in the plasma generating region 57.

This second embodiment is based on further thoughtful consideration. In order to prevent the radical condition of the gaseous silicon-containing compound in the plasma generating region 57 from becoming uneven by the downward supply and discharge of the gas, the meshes of the cylindrical portion 54a of the mesh structure 54 are made coarser further from the top of the cylinder.

Accordingly, gas containing fresher silicon is fed into the plasma generating region 57 through the lower part of the cylindrical portion 54a of the mesh structure 54. Thus, the vertical radical distribution of the gas in the plasma generating region 57 is protected against unevenness.

Also in the amorphous silicon film forming apparatus according to the second embodiment adapted to a photoconductive drum for electrophotography, as described above, the plasma generating region 57 is surrounded by the mesh structure 54 so that only a required amount of gas can be supplied to the region 57. Therefore, there is no possibility of by-products from silicon powder being produced by polymerization of useless radicals. Further, since plasma is sealed in the mesh structure 54, a positive column (not shown) with high luminous intensity is produced in the vicinity of the surface of the drum-shaped substrate 48. Thus, like the apparatus of the first embodiment using the flat substrate (shown in FIGS. 2 and 3), the film forming apparatus of the second embodiment can perform a high-speed film forming operation.

Another specific example will now be described in detail.

The vacuum reaction vessel 41 is evacuated to $10^{-6}$ torr. The heater 47 is actuated to heat the drum-shaped substrate 48 to 230° C. At this time, the drum-shaped substrate 48 is being rotated by the motor 43. The valve 49 is opened, and 500 SCCM of pure SiH4 gas is introduced into the vacuum reaction vessel 41. At the same time, the exhaust mechanism 53 is switched from a high-vacuum exhaust system using a diffusion pump and a rotary pump to a large-flow exhaust system using a mechanical booster pump and a rotary pump.

After the pressure inside the vacuum reaction vessel 41 is adjusted to 0.5 torr, a high-frequency output of 600 W is applied to the facing electrode/gas jet member 42. Thus, an a-Si:H film (not shown) is formed in one hour.

After the passage of the one hour, the gas supply is stopped, the heater 47 is switched off, the valve 52 is fully opened, and the vacuum reaction vessel 41 is evacuated again to $10^{-4}$ torr. When the temperature of the drum-shaped substrate 48 is lowered to 100° C. or less, the substrate 48 is taken out into the open air.

Only a few by-products from silicon powder were found at the bottom portion of the vacuum reaction vessel 42.

The thickness of the a-Si:H film formed in this manner measured 20 microns.

When the a-Si:H photoconductive drum was subjected to DC corona charge at $-6.6$ kV, a surface potential of $-200$ V was obtained. Then, when a tungsten light of 2 lx was applied to the photoconductive drum, the exposure sensitivity of half decay proved to be 0.6 lx.sec. This figure is by no means different from that for the a-Si:H photosensitive film formed at low speed in the prior art apparatus.

When the surface of the a-Si:H photosensitive film was observed through a stereoscopic microscope of 600 magnifications, there was found no flakes as by-products from silicon powder.

As described above, the plasma obtained from the gaseous silicon-containing compound or the gaseous silicon-containing compound mixture is surrounded by the mesh structure, so that most of the introduced gas is forced to flow outside the mesh structure. Since the radicals of the gaseous silicon-containing compound or the gaseous silicon-containing compound mixture in the mesh structure are reduced, only a required amount of gas is allowed to be fed through the mesh structure into the plasma generating region by the difference between the gas densities in- and outside the mesh structure. In the amorphous silicon film forming apparatus of the second embodiment constructed in this manner, high-speed film forming can be achieved by producing a positive column of plasma in the vicinity of the substrate surface. Also, high quality a-Si film can be obtained without producing any by-products from silicon powder and hence without requiring much time for the cleaning of the vacuum reaction vessel with every cycle of film forming operation.

According to the present invention, as described above, a region where a plasma of a gaseous silicon-containing compound is produced is surrounded by a conductive mesh structure in an amorphous silicon film forming apparatus which forms an amorphous silicon film on a filming object by introducing the gaseous silicon-containing compound into a reaction chamber and causing a glow discharge. Thus, there may be provided an amorphous silicon film forming apparatus capable of a high-speed film forming operation and of preventing the production of powdered by-products in the reaction chamber to ensure formation of very satisfactory amorphous silicon films, despite its simple construction, and facilitating maintenance.

What is claimed is:

1. An amorphous silicon film-forming apparatus for forming an amorphous silicon film on a drum member, comprising:
   a sealed vessel having an interior wall which establishes a reaction chamber;
   gas inlet means for introducing a silicon-containing gas into the reaction chamber;
   bearer means, including an electrically grounded based, for supporting said drum member;
   plasma generating means, including an electrode spaced from and surrounding said bearer means so that said electrode establishes a plasma generating region with said base, and power source means for causing an electrical discharge to thereby produce a plasma of said gas in said plasma generating region; and
   a conductive mesh structure which is disposed in the reaction chamber and surrounds the plasma generating region and the drum member, the portion of the mesh structure facing the outer periphery of the drum member being in the form of a drum and spaced at a constant distance therefrom, and the mesh structure also being separated from said interior wall such that an annular space is defined in said reaction chamber between said mesh structure and said interior wall, wherein said inlet means introduces said silicon-containing gas into said annular space such that said silicon-containing gas surrounds said mesh structure, and wherein a portion of said silicon-containing gas in said annular space enters said plasma generating region through said mesh structure to produce a plasma of said gas and form a film on said substrate, owing to the difference in density between the gas in the annular space and the gas in the plasma generating region, the density of which is reduced by forming the film on the substrate.

2. The amorphous silicon film forming apparatus according to claim 1, wherein said mesh structure is spaced from the outer periphery of the drum-shaped filming object at a distance shorter than the mean free path of electrons existing in the plasma generating region.

3. The amorphous silicon film forming apparatus according to claim 2, wherein said mesh structure is electrically connected to the electrode.

4. The amorphous silicon film forming apparatus according to claim 3, wherein said gas inlet means includes a hollow conductive gas inlet member surrounding the drum-shaped filming object.

5. The amorphous silicon film forming apparatus according to claim 4, wherein said gas inlet member is connected to the power source for discharge and also saves as the electrode.

6. The amorphous silicon film forming apparatus according to claim 5, wherein the mesh size of said mesh structure is substantially 50 holes/inch.

* * * * *

UNITED STATES PATENT AND TRADEMARK OFFICE
CERTIFICATE OF CORRECTION

PATENT NO. : 4,633,809
DATED : January 6, 1987
INVENTOR(S) : Masataka Hirose, et al It is certified that error appears in the above-identified patent and that said Letters Patent is hereby corrected as shown below:

At box [73] please list assignees as follows:

--Masataka Hirose, Hiroshima, Japan--

Kabushiki Kaisha Toshiba, Kawasaki -Shi, Japan --.

Signed and Sealed this

First Day of September, 1987

*Attest:*

DONALD J. QUIGG

*Attesting Officer*          *Commissioner of Patents and Trademarks*